US006084258A

United States Patent [19]
Tokushima

[11] Patent Number: 6,084,258
[45] Date of Patent: Jul. 4, 2000

[54] METAL-SEMICONDUCTOR JUNCTION FET

[75] Inventor: Masatoshi Tokushima, Tokyo, Japan

[73] Assignee: NEC Corporation, Tokyo, Japan

[21] Appl. No.: 08/876,987

[22] Filed: Jun. 16, 1997

Related U.S. Application Data

[63] Continuation of application No. 08/602,466, Feb. 16, 1996, abandoned.

[30] Foreign Application Priority Data

Feb. 20, 1995 [JP] Japan .................................... 7-055091

[51] Int. Cl.[7] ......................... H01L 29/80; H01L 31/112; H01L 29/76

[52] U.S. Cl. .......................... 257/280; 257/281; 257/284; 257/412

[58] Field of Search .................................... 257/279, 280, 257/281, 284, 411, 192, 412, 194

[56] References Cited

U.S. PATENT DOCUMENTS 5,272,372 12/1993 Kuzuhara et al. ...................... 257/280
5,285,087 2/1994 Narita et al. ............................ 257/192
5,317,190 5/1994 Fleischman et al. ................... 257/743
5,391,899 2/1995 Kohno .................................... 257/192

*Primary Examiner*—Wael M. Fahmy
*Attorney, Agent, or Firm*—Hayes Soloway Hennessey Grossman & Hage PC

[57] ABSTRACT

A MESFET has a metallic laminate including $WSi_x$, Ti, Pt and Au films and implementing gate, source and drain electrodes of the MESFET and interconnects therefor. The substrate of the MESFET is formed of a substrate body, a first semiconductor layer made of $n^+$-GaAs doped with Si at a concentration of $2\times10^{18}$ atoms/cm$^3$ and a second semiconductor layer made of $n^+$-InGaAs doped with Si at a concentration of $1\times10^{19}$ atoms/cm$^3$. The source and drain electrodes contact the second semiconductor layer in an ohmic contact while the gate electrode contacts the first semiconductor layer in a Schottky contact through a hole formed in the second semiconductor layer. A reduced number of steps in manufacture of the MESFET can be obtained, thereby reducing fabrication costs of the MESFET.

7 Claims, 7 Drawing Sheets

METAL-SEMICONDUCTOR JUNCTION FET

This is a continuation of application Ser. No. 08/602,466 filed on Feb. 16, 1996, now abandoned.

BACKGROUND OF THE INVENTION (a) Field of the Invention

The present invention relates to a metal-semiconductor junction field effect transistor (MESFET) and, more particularly, to a structure of electrodes of a MESFET.

(b) Description of the Related Art

Various methods have been used in fabrication of a MESFET to form electrodes and interconnects thereof. A method for manufacturing a conventional GaAs MESFET will be described first with reference to FIGS. 1A to 1K.

A GaAs substrate designated by reference numeral 100 includes a substrate body 101 made of undoped GaAs (i-GaAs) and an $n^+$-GaAs layer 102 doped with Si at a concentration of $2\times10^{18}$ atoms/$cm^3$ and formed on the substrate body 101 to a thickness of 60 nanometers (nm).

First, a $SiO_2$ film 2 is formed on the GaAs substrate 100 to a thickness of 300 nm (FIG. 1A). A photoresist pattern 26 is then formed on the $SiO_2$ film 2, and a gate electrode opening 27 is formed in the $SiO_2$ film 2 by reactive ion etching with $CF_4$ gas and using the photoresist pattern 26 as a mask (FIG. 1B). After removal of the photoresist pattern 26, a surface portion of the $n^+$-GaAs layer 102 of the GaAs substrate 100 exposed in the gate electrode opening 27 is removed by a wet etching using a phosphoric-acid-based etchant, whereby a gate recess 28 is formed on the $n^+$-GaAs layer 102 beneath the gate electrode opening 27 (FIG. 1C). The recess 28 is formed in order to adjust the threshold voltage of the finished MESFET.

Subsequently, a $WSi_x$ metallic film 29 having a high melting point and a relatively high resistivity is deposited by sputtering in a thickness of 500 nm (FIG. 1D), and subjected to patterning together with the $SiO_2$ film 2 to form a gate electrode 29A by reactive ion ethching with $CF_4$ and $SF_6$ gas mixture and using a second photoresist film 31 as a mask, gate electrode 29A having a Schottky contact 30 between the same and the $n^+$-GaAs layer 102 (FIG. 1E). After removal of the second photoresist pattern 31, a third photoresist pattern 42 is formed to cover the gate electrode 29A, the photoresist pattern 31 having openings 43 for exposing the $n^+$-GaAs layer 102 at the locations where source and drain electrodes are to be formed. A metallic laminate 44 including AuGe/Ni/Au films is then deposited on the entire surface including the surface of the $n^+$-GaAs layer 102 at the bottom of the openings 43 (FIG. 1F). The metallic laminate 44 formed on the photoresist pattern 42 is then removed by a lift-off method. A heat treatment is then performed to form alloy ohmic contacts 44A between the source and drain electrodes to be formed and the $n^+$-GaAs layer 102 (FIG. 1G).

Thereafter, a second $SiO_2$ film 32 is deposited (FIG. 1H) on the entire surface and subjected to planarization (FIG. 1I). Subsequently, a gate electrode contact hole 34, a source electrode contact hole 35, and a drain electrode contact hole 36 are formed in the $SiO_2$ film 32 by a photolithographic technique using a fourth photoresist pattern 33 as a mask (FIG. 1J).

After removal of the photoresist pattern 33, a metallic laminate 37 including Ti/Pt/Au films and having a small resistance is deposited on the entire surface including the surfaces of $SiO_2$ film 32, gate electrode 29A and the alloy ohmic contacts 44A for the source and drain (FIG. 1K). The metallic laminate 37 is then subjected to patterning by Arion milling and using a fifth photoresist pattern 38 as a mask, thereby obtaining source electrode 40, gate interconnect 39 and drain electrode 41 (FIG. 1L). Finally, as a result of removal of the fifth photoresist pattern 38, a finished MESFET is obtained (FIG. 1K). The Ti/Pt/Au metallic laminate 39, 40, 41 has a small resistance to thereby obtain a high speed operation of the resultant MESFET.

With the process for manufacturing the conventional MESFET as described above, a large number of deposition and photolithographic steps are needed, which increases fabrication costs of the MESFET.

SUMMARY OF THE INVENTION

In view of the foregoing, it is an object of the present invention to provide a MESFET which can be manufactured by a reduced number of deposition and photolithographic steps and thereby can be manufactured at a reduced cost.

The present invention is directed to a MESFET comprising: a substrate including a semiconductor substrate body and a first layer formed on said substrate body, said first layer having a hole exposing a portion of said substrate body; an insulator layer formed on said first layer and having first, second and third openings consecutively arranged, said second openings being disposed above said hole; a metallic laminate implementing gate, source and drain electrodes formed on said insulator layer, said source and drain electrodes passing said first and third openings, respectively, to contact said first layer in ohmic contacts, said gate electrode passing said second opening and said hole to contact said substrate body in a Schottky contact.

In accordance with the MESFET according to the present invention, a single metallic laminate can be patterned to obtain gate, source and drain electrodes, so that the number of deposition and photolithographic steps can be reduced, thereby reducing the fabrication cost of the MESFET.

The above and other objects, features and advantages of the present invention will be more apparent from the following description.

DETAILED DESCRIPTION OF THE PREFERRED EMBODIMENT

Figure 1A:
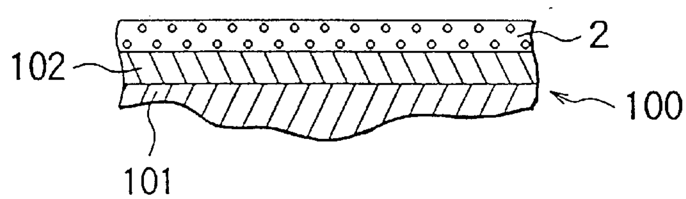
FIGS. 1A to 1M are cross-sectional views of a conventional MESFET in consecutive steps of a process for manufacturing the MESFET.
Figure 1B:
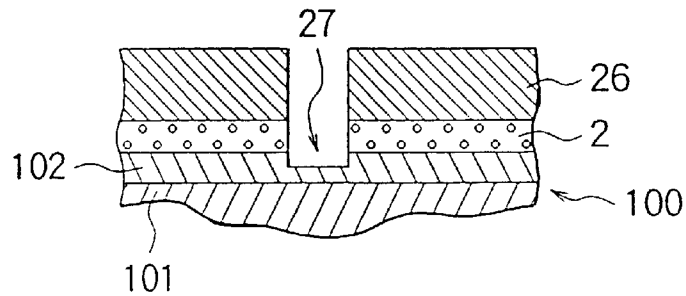
Figure 1C:
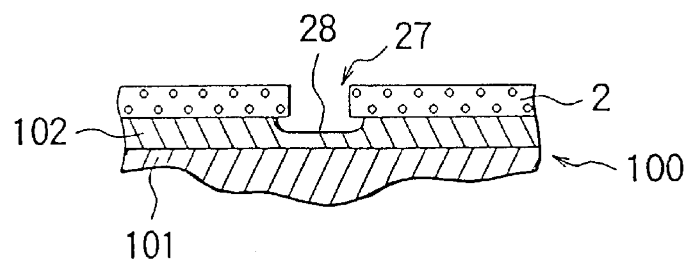
Figure 1D:
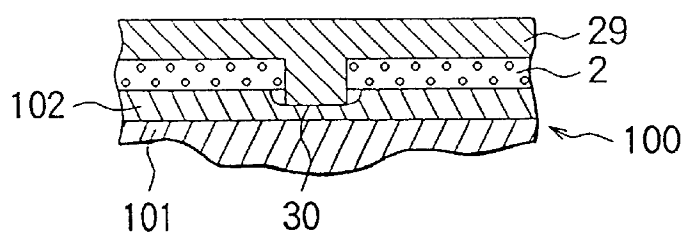
Figure 1E:
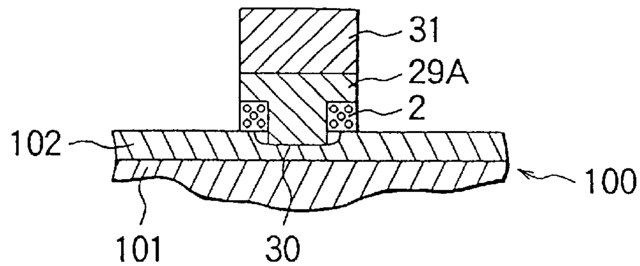
Figure 1F:
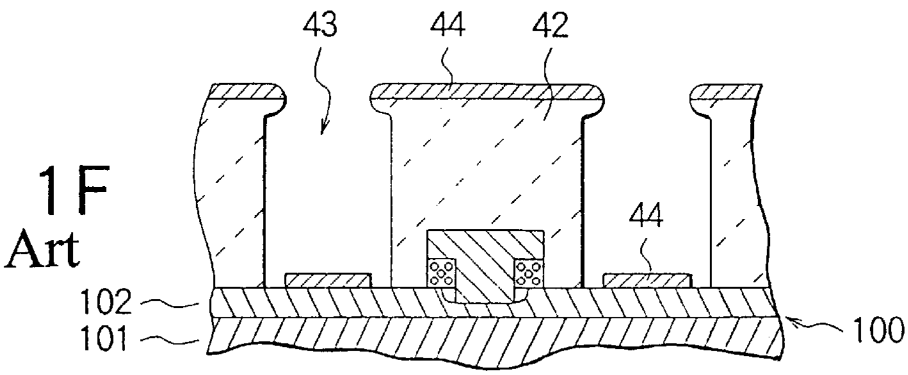
Figure 1G:
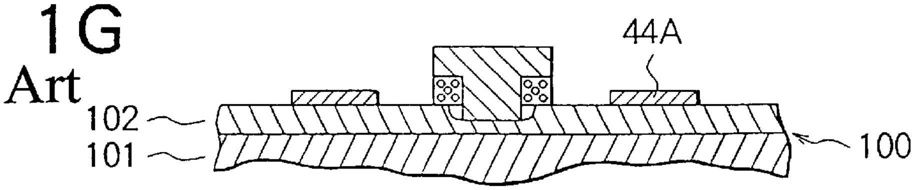
Figure 1H:
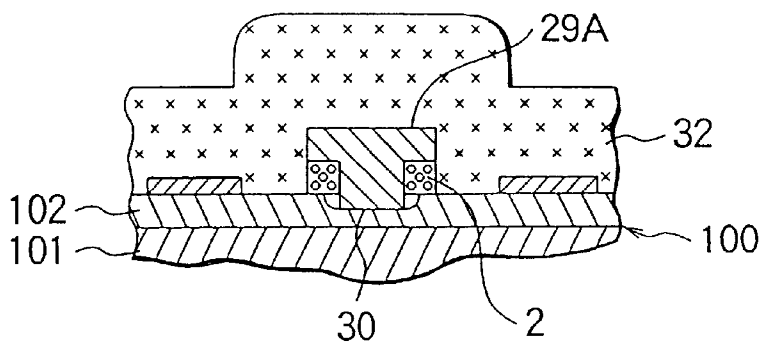
Figure 1I:
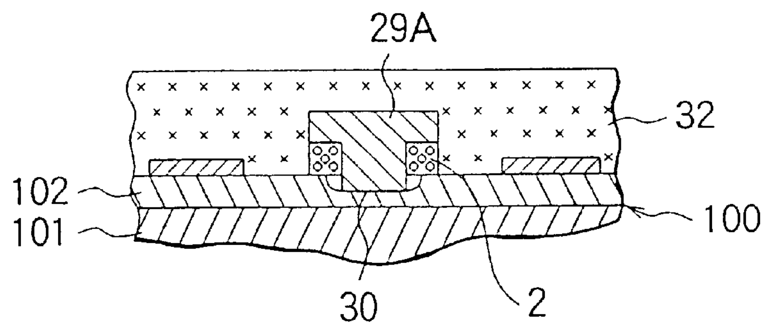
Figure 1J:
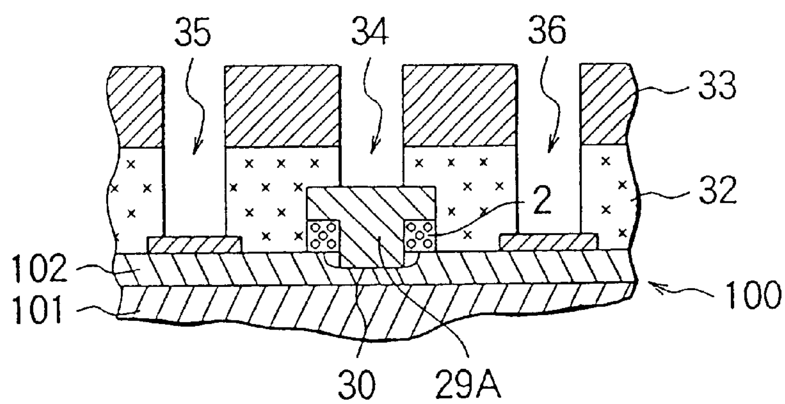
Figure 1K:
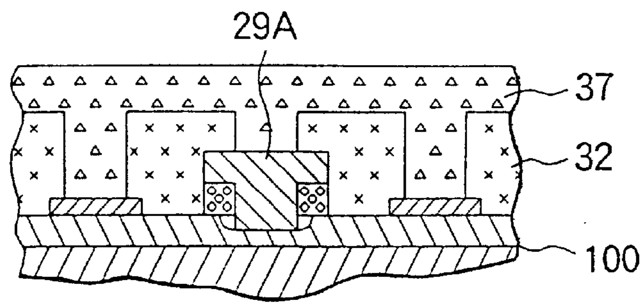
Figure 1L:
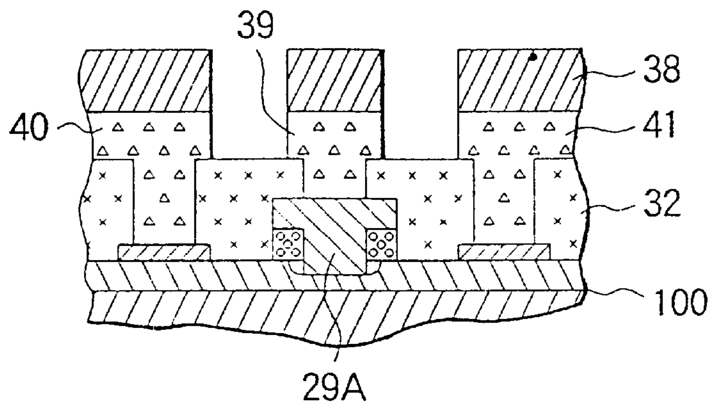
Figure 1M:
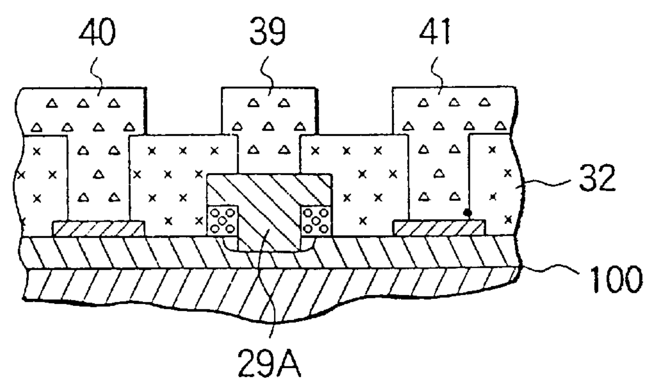

Now, a preferred embodiment of the present invention will be described with reference to the accompanying drawings in which similar elements or elements having similar functions may be designated by the same or similar reference numerals.

Figure 2A:
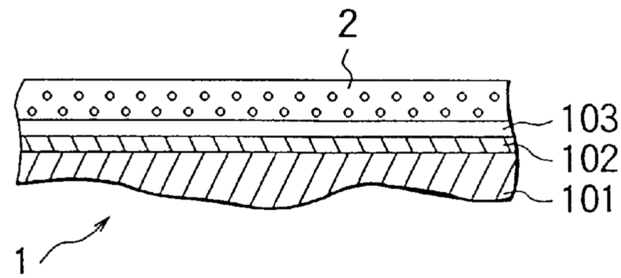
FIGS. 2A to 2F are cross-sectional views of a MESFET according to an embodiment of the present in consecutive steps of a process for manufacturing the MESFET.

FIGS. 2A to 2F show a process for manufacturing a MESFET according to the embodiment of the present invention. Referring to FIG. 2A, a compound semiconductor substrate 1 has a substrate body or base 101 made of undoped GaAs (i-GaAs), an $n^+$-GaAs layer 102 doped with Si at a concentration of $2\times10^{18}$ atoms/$cm^3$ and grown on the substrate body 101 to a thickness of 60 nm, and an $n^+$-$In_{0.3}Ga_{0.7}As$ layer 103 doped with Si at a concentration of $1\times10^{19}$ atoms/$cm^3$ and grown on the $n^+$-GaAs layer 102 to a thickness of 30 nm. On the GaAs substrate 1, a $SiO_2$ film 2 is formed to a thickness of 300 nm.

Figure 2B:
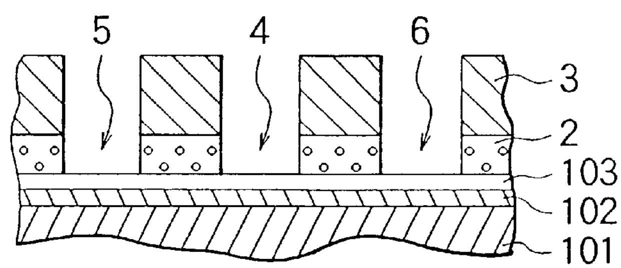
Figure 2C:
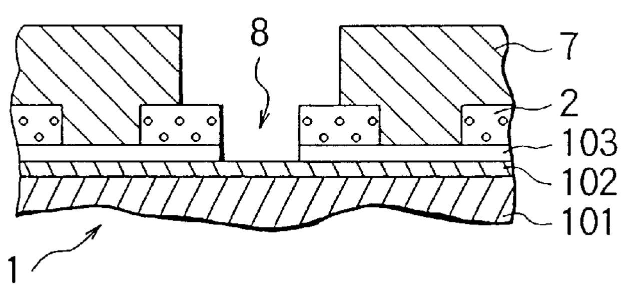

By reactive ion etching with $CF_4$ gas and using a first photoresist pattern 3 formed on the $SiO_2$ film 2 as a mask, a gate electrode opening 4, a source electrode opening 5, and a drain electrode opening 6 consecutively arranged in a row are formed in the $SiO_2$ film 2 (FIG. 2B). After removal of the first photoresist pattern 3, the source electrode opening 5 and the drain electrode opening 6 are covered with a second photoresist pattern 7. Then, a portion of the $n^+$-$In_{0.3}Ga_{0.7}As$ layer 103 of the substrate 1 exposed in the gate electrode opening 4 is removed by a wet etching using a phosphoric-acid-based etchant, so that a hole 8 is formed in the $n^+$-$In_{0.3}Ga_{0.7}As$ layer 103 for exposing $n^+$-GaAs layer 102 of the substrate 1 (FIG. 2C).

Figure 2D:
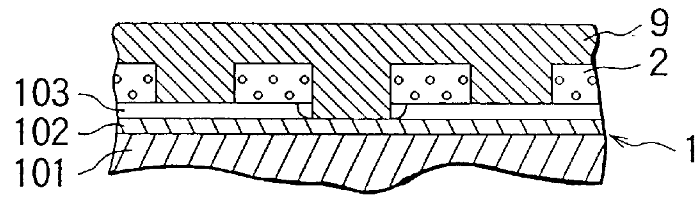
Figure 2E:
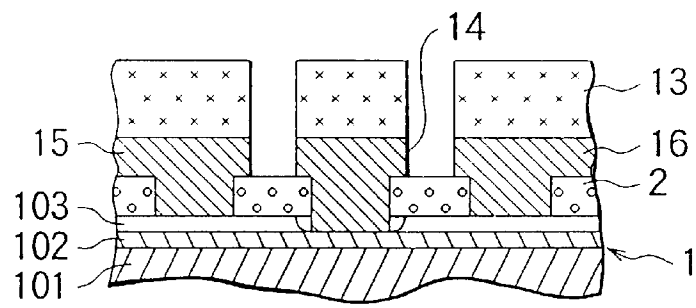
Figure 2F:
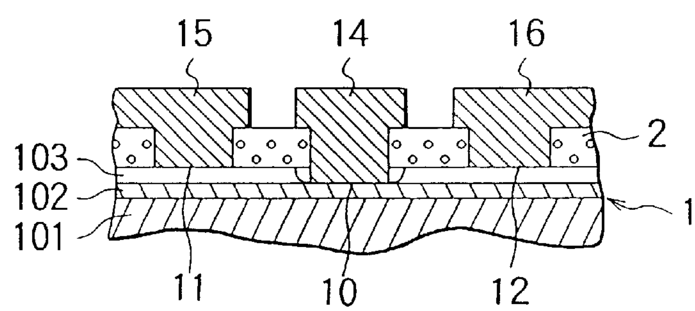

Subsequently, a $WSi_x$/Ti/Pt/Au metallic laminate 9 including consecutively, as viewed from the bottom, a 50 nm-thick $WSi_x$ film, a 10 nm-thick Ti film, a 30 nm-thick Pt film and a 410 nm-thick Au film is formed (FIG. 2D). The metallic laminate 9 is selectively etched by Ar-ion milling and using a second photoresist pattern 13 as a mask (FIG. 2E) to form a gate electrode 14 contacting the $n^+$-GaAs layer 102 in a Schottky contact 10 as well as a source electrode 15 and a drain electrode 16 each contacting the $n^+$-$In_{0.3}Ga_{0.7}As$ layer 103 in an ohmic contact 11 or 12 (FIG. 2F). The bottom $WSi_x$ film of the metallic laminate 9 and the $n^+$-GaAs layer 102 of the substrate 1 form an excellent Schottky contact while the bottom $WSi_x$ film and the $n^+$-$In_{0.3}Ga_{0.7}As$ layer 103 form an excellent ohmic contact between them without any alloy contact interposed therebetween.

As described above, the use of $WSi_x$/Ti/Pt/Au laminate including $WSi_x$ film having a high melting point and Ti/Pt/Au films having a small resistance, allows the gate, source and drain electrodes and corresponding interconnects to be formed from a single combination of metallic materials.

Figure 3:
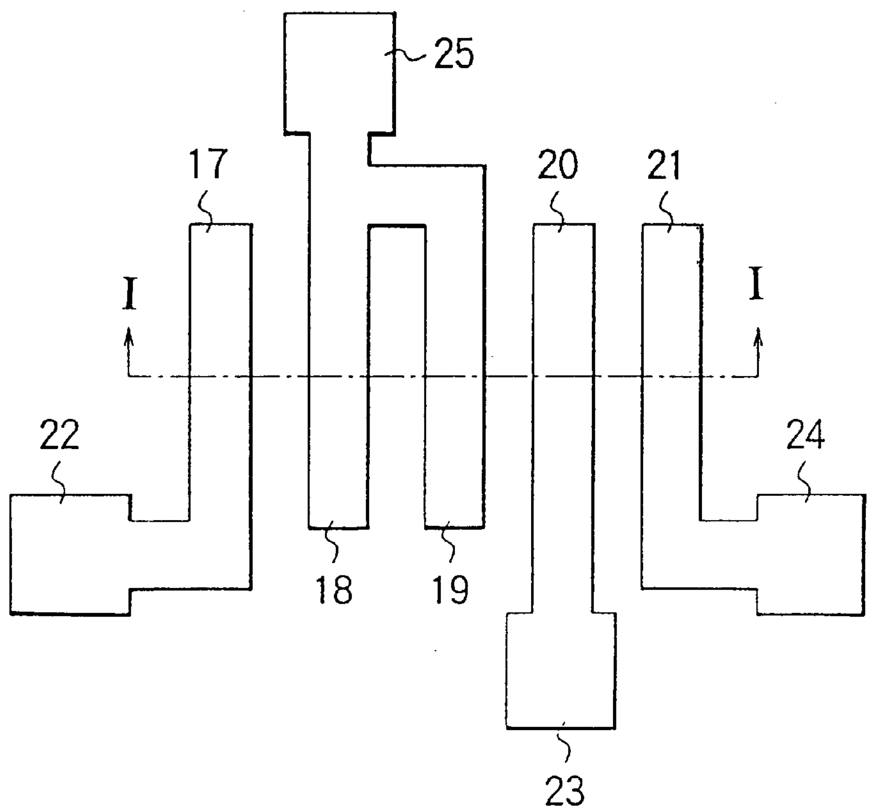
FIG. 3 is a plan view showing a practical layout of interconnects of MESFETs according to the embodiment of FIGS. 2A to 2F.
Figure 4:
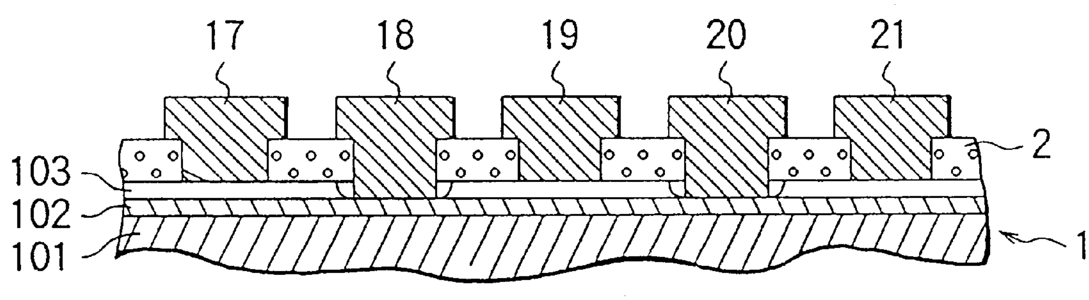
FIG. 4 is a cross-sectional view taken along line I—I in FIG. 3.

Some modifications can be possible in the embodiment as described above. For example, the substrate may be formed of a $n^+$-GaAS substrate body and a single $n^+$-InGaAs layer instead of the two layer structure formed on the undoped substrate body. Further, the $n^+$-InGaAs layer may have a composition $In_xGa_{1-x}As$ wherein x is between 0.1 and 0.9. The concentration of Si in the n-GaAs layer 102 may be in the range between about $1\times10^{17}$ and about $5\times10^{18}$ atoms/$cm^3$ while the concentration of Si in the $n^+$-InGaAs layer 103 may be in the range between about $1\times10^{19}$ and about $1\times10^{20}$ atoms/$cm^3$. Alternatively, a $n^+$-GaAs substrate doped with Si at a concentration of $2\times10^{18}$ may be used in which the second layer of the substrate is substantially made of an alloy film including Ni and Ge, for example, where part of the Ge is diffused into the $n^+$-GaAs layer to form an ohmic contact between the Ni/Ge layer and the $n^+$-GaAs layer, and having a hole for the gate electrode contacting the first layer in a Schottky contact. FIGS. 3 and 4 show an exemplified practical layout of electrodes of MESFETs according to the embodiment as described above. FIG. 3 is a schematic plan view of the electrodes and interconnects of the MESFETs while FIG. 4 is a sectional view taken along line A—A in FIG. 3.

FIGS. 3 and 4 includes two MESFETs including a driver FET and a load FET therefor. The electrodes and interconnects of the MESFETs are formed from a single $WSi_x$/Ti/Pt/Au laminate by a single step of patterning such as executed at the step shown in FIG. 2E. The drain electrode 17 and the source electrode 19 of the load FET are opposed to each other, with the gate electrode 18 of the load FET being interposed therebetween, while the drain electrode 19 and source electrode 21 of the driver FET are opposed to each other, with the gate electrode 20 of the drive FET being interposed therebetween.

The source electrode 19 of the load FET and the drain electrode 19 of the driver FET are implemented by the same electrode. In other words, the electrode 19 serves as both the source electrode of the load FET and the drain electrode of the driver FET. The gate electrode 18 and the source electrode 19 of the load FET are connected together to a pad 25. The drain electrode of the load FET, the gate electrode and the source electrode of the driver FET are connected to pad 22, pad 23 and 24 respectively.

As shown in FIG. 4, the electrodes 17 through 21 are consecutively arranged in a row to form two of the MESFETs provided by the embodiment as described before. The gate electrodes 18 and 20 contact the $n^+$-GaAs layer 102 in a Schottky contact while the source and drain electrodes 17, 19 and 21 contact the $n^+$-InGaAs layer 103 in an ohmic contact.

Since above embodiment is described only for examples, the present invention is not limited to such embodiment and it will be obvious for those skilled in the art that various modifications or alterations can be easily made based on the above embodiment within the scope of the present invention.

What is claimed is:

1. A metal-semiconductor junction field effect transistor (MESFET) comprising: a substrate including a semiconductor substrate body and a first layer formed on said semiconductor substrate body, said first layer having a hole exposing a portion of said semiconductor substrate body; an insulator layer formed on said first layer and having first, second and third openings consecutively arranged, said second opening being disposed above said hole; a commonly formed metallic laminate implementing gate, source and drain electrodes having portions formed on said insulator layer, said source and drain electrodes passing said first and third openings, respectively, to contact said first layer in ohmic contacts, said gate electrode passing said second opening and said hole to contact said semiconductor substrate body in a Schottky contact, wherein said gate electrode extends to a height substantially equal to the height of said source and drain electrodes;

said electrodes being formed after formation of said insulating layer by removing said first layer to expose a portion of said substrate body to obtain said Schottky contact for said gate electrode and depositing said metallic laminate to simultaneously form said source and drain electrodes.

2. A MESFET as defined in claim 1 wherein said semiconductor substrate body is formed of an undoped GaAs base and a semiconductor layer grown on said undoped GaAs base.

3. A MESFET as defined in claim 2 wherein said semiconductor layer is substantially made of GaAs doped with silicon at a concentration of $1\times10^{17}$ to $5\times10^{18}$ atoms/$cm^3$.

4. A MESFET as defined in claim 2 wherein said first layer is substantially made of an alloy including Ni and Ge for forming an ohmic contact between said first layer and said substrate.

5. A MESFET as defined in claim 1 wherein said semiconductor substrate body is substantially made of $In_xGa_{1-x}As$, where x is between 0.1 and 0.9.

6. A MESFET as defined in claim 1 wherein said metallic laminate includes $WSi_x$, Ti, Pt and Au films consecutively deposited as viewed from the bottom of the laminate.

7. A metal-semiconductor field effect transistor (MESFET) comprising: a substrate including a semiconductor substrate body; a first layer formed on said semiconductor substrate body, said first layer being substantially made of either $In_xGa_{1-x}As$ doped with silicon at a concentration of $10^{19}$ to $10^{20}$ atoms/cm$^3$ where x is between 0.1 and 0.9, or an alloy including Ni and Ge, said first layer having a hole exposing a portion of said semiconductor substrate body; an insulator layer formed on said first layer and having first, second and third openings consecutively arranged, said second opening being disposed above said hole; and a commonly formed metallic laminate implementing gate, source and drain electrodes formed on said insulating layer, said source and drain electrodes passing said first and third openings, respectively, and contacting said first layer in ohmic contact, said gate electrode passing said second opening and said hole and contacting said semiconductor substrate body in a Schottky contact, wherein said gate electrode extends to a height substantially equal to the height of said source and drain electrodes;

said electrodes being formed after formation of said insulating layer by removing said first layer to expose a portion of said substrate body to obtain said Schottky contact for said gate electrode and depositing said metallic laminate to simultaneously form said source and drain electrodes.

* * * * *